US006559712B2

(12) United States Patent
Gabet et al.

(10) Patent No.: US 6,559,712 B2
(45) **Date of Patent: *May 6, 2003**

(54) METHOD AND DEVICE FOR THE GENERATION OF A RANDOM SIGNAL WITH CONTROLLED HISTOGRAM AND SPECTRUM

(75) Inventors: Pascal Gabet, Cholet (FR); Jean-Luc De Gouy, Briis Sous Forges (FR)

(73) Assignee: Thales, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 10/042,199

(22) Filed: Jan. 11, 2002

(65) Prior Publication Data

US 2002/0095449 A1 Jul. 18, 2002

(30) Foreign Application Priority Data

Jan. 16, 2001 (FR) ............................................ 01 00541

(51) Int. Cl.[7] ............................ H03B 1/00; H03K 5/00
(52) U.S. Cl. ....................................... 327/551; 327/100
(58) Field of Search ......................... 327/100, 103–106, 327/551–553, 555–559; 341/126, 143, 144, 155; 708/300

(56) References Cited

U.S. PATENT DOCUMENTS

| | | | | |
|---|---|---|---|---|
| 6,023,191 A | * 2/2000 | Connell et al. | ............. | 327/337 |
| 6,075,474 A | 6/2000 | Gabet et al. | ................ | 341/143 |
| 6,137,349 A | * 10/2000 | Menkhoff et al. | .......... | 327/552 |
| 6,262,604 B1 | 7/2001 | Gabet et al. | ................ | 327/107 |
| 6,307,492 B1 | 10/2001 | Berranger et al. | .......... | 341/131 |
| 6,337,643 B1 | 1/2002 | Gabet et al. | ................ | 341/131 |

FOREIGN PATENT DOCUMENTS

FR 2 783 374 3/2000

OTHER PUBLICATIONS

Lawrence T. Moliasa, et al., "On the Generation of Non–Gaussian Noise Using the Discrete–Fourier Transform Method", IEEE Proceedings of The Instrumentation and Measurement Technology Conference, Apr. 23, 1995, pp. 72–78.

* cited by examiner

*Primary Examiner*—My-Trang Nu Ton
(74) *Attorney, Agent, or Firm*—Oblon, Spivak, McClelland, Maier & Neustadt, P.C.

(57) ABSTRACT

A method and device for the generation of a random signal, comprising:

A first step (a) for the generation of a pseudo-random signal, a second step (b) for the filtering ($F_1$) of the signal coming from the step (a) to obtain a signal x(t) having a predetermined spectral envelope H(f), a third step (c) in which a non-linear function g is applied to the signal x(t) so as to form a signal y(t) and create overshoots on the edges of the histogram of the signal y(t), a fourth filtering ($F_2$) step (d) used to smoothen the overshoots of the histogram of the signal y(t), compensate for the effect of the non-linearity and carry out an additional filtering at ($F_1$).

Application to a system of analog-digital conversion or digital-analog conversion.

11 Claims, 7 Drawing Sheets

METHOD AND DEVICE FOR THE GENERATION OF A RANDOM SIGNAL WITH CONTROLLED HISTOGRAM AND SPECTRUM

BACKGROUND OF THE INVENTION

1. Field of the Invention

The present invention relates to a method and device for the generation of a random signal. The invention can be applied especially to the field of digital-analog conversion and analog-digital conversion using a random system of this kind.

It can be applied for example in the field of radar techniques or in that of instrumentation or again in the field of communications.

Conversion devices, whether digital-analog or analog-digital conversion devices, are very widely used in many systems, and their performance characteristics are generally an essential point of these systems as is illustrated in direct digital synthesis.

Direct digital synthesis is a technique of frequency synthesis in which the samples of a signal to be generated are elaborated in the form of digital values and these samples are converted into analog signals by means of a digital-analog converter. The signal synthesizers obtained by this technique are highly attractive in terms of volume, weight and energy consumption because they benefit from large-scale integration. The other advantages especially are very high resolution and very low switching time from one frequency to another. However, the passage of a useful signal into the digital-analog converter is accompanied by the creation of spurious signals due to the non-linearities of these converters. These non-linearities designate the fact that the stairs or steps of the transfer function of the digital-analog converter are not equal in height and that the transition between steps produces uneven phenomena.

The same problem can be found in applications based on analog-digital converters where the passage of the signals into these converters is accompanied here too by the creation of spurious signals due to the non-linearities.

2. Description of the Prior Art

There are known ways in the prior art of adding a random signal into the useful signal, before its passage into the converter, in order to reduce the level of the parasite signals by reducing the effect of the above-mentioned non-linearities of the converter. This random signal is commonly called "dither". The useful signal generally has a limited bandwidth and the clock frequency of the system, this system being for example a digital synthesizer, is generally greater than this band. This leaves a vacant spectral space in which to place the random signal.

To obtain full efficiency, this random signal must have certain characteristics. First of all, its spectrum must be controlled so that it does not encroach on the band of the useful signals. Secondly, it appears that the quality of the linearization of the converters depends on the histogram of the temporal amplitudes of the random signal. For example, a Gaussian relationship produces a linearization that is not as good as the one obtained by a rectangular relationship. There is therefore real advantage in being able to control both the spectrum and the histogram for the random signal.

There are known methods used to obtain a random signal with a given spectral envelope. Methods are also known to obtain a random signal with a given law of distribution of the amplitudes. These methods are described especially in works on the computation of probabilities such as, for example, J. Maurin, "Simulation déterministe du hazard" (Deterministic simulation of random processes), Editions Masson.

The patent FR 2 783 374 by the present applicant teaches a method and device for the generation of a random signal. It describes a method for the construction of a random signal in which the spectral envelope and the law of distribution of the temporal amplitudes are imposed simultaneously. To this end, the method implements a sequence of four signal-processing steps or operations in which the repetition of a part among them, especially the steps 3 and 4, make the parameters of the random signal converge toward the desired distribution. The iteration of the steps makes it possible to gradually approach the fixed distribution law and then to correct the spectral envelope.

Despite all its efficiency, this iterative method is not adapted to all types of computation, especially to the real-time computation of the random signal. It implies the use of various non-linear functions to restore the histogram aimed at in each iteration.

The idea of the invention is based on a novel approach enabling the real-time computation of a random signal with a predetermined spectral envelope and a histogram of amplitudes close to a rectangular distribution, namely any equi-distributed relationship.

Hereinafter in the invention, the term "useful signal" designates the signal to be converted, without distortion, by a DAC or an ADC. To this end, the random signal or noise that is generated by the device according to the invention is added to this useful signal so as to linearize the transfer characteristic of the DAC or ADC.

SUMMARY OF THE INVENTION

An object of the invention is a method for the generation of a random signal. The method comprises at least the following steps:

A first step (a) for the generation of a pseudo-random signal, a second step (b) for the filtering ($F_1$) of the signal coming from the step (a) to obtain a signal x(t) having a predetermined spectral envelope H(f), a third step (c) in which a non-linear function g is applied to the signal x(t) so as to form a signal y(t) and create overshoots on the edges of the histogram of the signal y(t), a fourth filtering ($F_2$) step (d) used to smoothen the overshoots of the histogram of the signal y(t), compensate for the effect of the non-linearity and carry out an additional filtering at ($F_1$).

The overshoots are more or less pronounced, depending especially on the shape of the final histogram.

According to one embodiment, the non-linear function is, for example, a function with facets $D_i$ and the number of the segments and the ratio of the slopes of the different segments are chosen as a function of the histogram obtained in the filtering step $F_1$.

The pseudo-random signal is, for example, a white noise.

An object of the invention is also a device for the implementation of the above-described method comprising for example at least the following elements:

a) means to generate a pseudo-random signal, b) means ($F_1$) to filter the pseudo-random signal in order to obtain a signal x(t) having a predetermined spectral envelope H(f), c) a device adapted to generating a non-linear function to form a signal y(t) from the signal x(t) having a Gaussian type of histogram, the histogram of this signal y(t) being of a rectangular type with overshoots, d) means ($F_2$) adapted to smoothening the overshoots of the histogram of the signal y(t), compensating for the effect of non-linearity and making an additional filtering at ($F_1$).

The signal generated is, for example, a white noise.

The invention in particular has the following advantages:

it improves the non-linearities of the analog-digital converters or digital-analog converters it is applicable to many systems, it is economical and simple in its implementation

BRIEF DESCRIPTION OF THE DRAWINGS

Other features and advantages of the invention shall appear from the following description, made with reference to the appended drawings by way of a non-restrictive illustration. Of these drawings.

MORE DETAILED DESCRIPTION

Figure 1:
FIG. 1 is an illustration of possible steps of the method according to the invention.

FIG. 1 describes a possible example of the steps implemented by the method according to the invention. This method consists especially of the sequence of signal-processing steps or operations enabling the real-time computation of a random signal with a predetermined spectral envelope and a histogram of amplitudes close to a rectangular distribution, namely an equidistributed relationship.

The method according to the invention comprises a first step (a) in which a pseudo-random code is generated, for example by means of a PRN (pseudo-random noise) generator 1. The PRN generator is built, for example, out of a shift register feedback-looped by means of one or more XOR circuits. This type of generator is described in many articles and books, for example Simon, Omura, Scholtz and Levitt, <<Spread Spectrum Communications>> Volume 1.

The pseudo-random signal generated is, for example, a white noise.

The PRN generator delivers digital words on m bits, for example, at its output. The values of these words are equidistributed in the amplitude interval $[-2^{m-1}, 2^{m-1}-1]$ and their spectral envelope is constant between the frequency 0 and the frequency $F_H/2$ where $F_H$ is the clock frequency that sets the rate of the shifts of the register.

Figure 2:
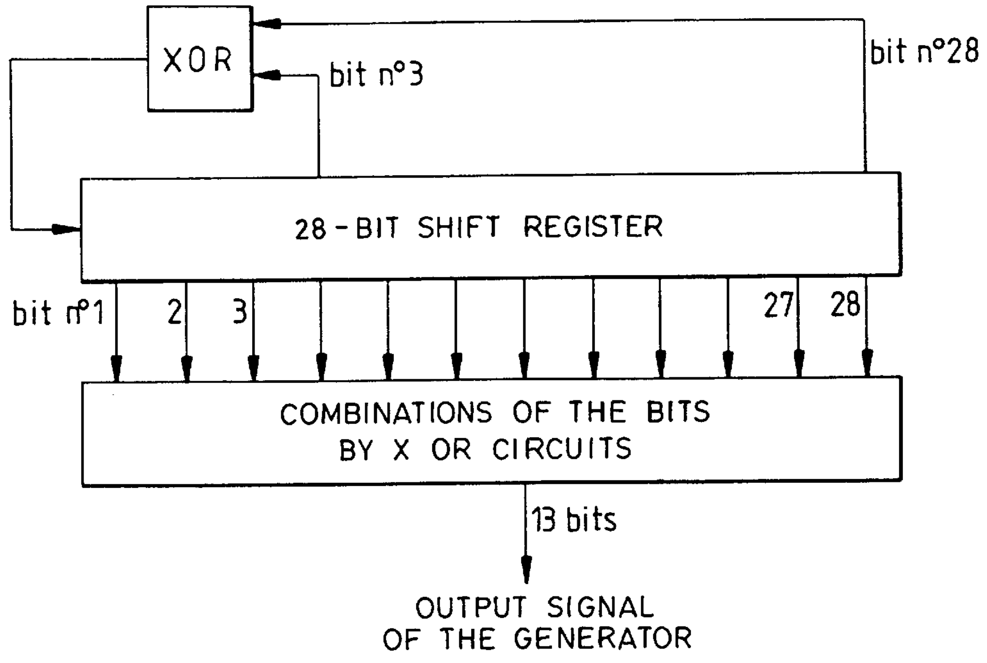
FIG. 2, shows a detailed example of a pseudo-random code generator.

For example, FIG. 2 shows a block diagram of a PRN generator made out of a 28-bit shift register 30.

The bits No. 3 and 28 are combined by an XOR circuit 31, whose output is reinjected into the input 32 of the register to give an operating cycle with a maximum length equal to $2^{28}-1$ clock strokes. The 28 bits of the register are then combined by XOR circuits 33 to give rise to a random signal on m bits with m=13 bits in the example of FIG. 2.

Figure 3:
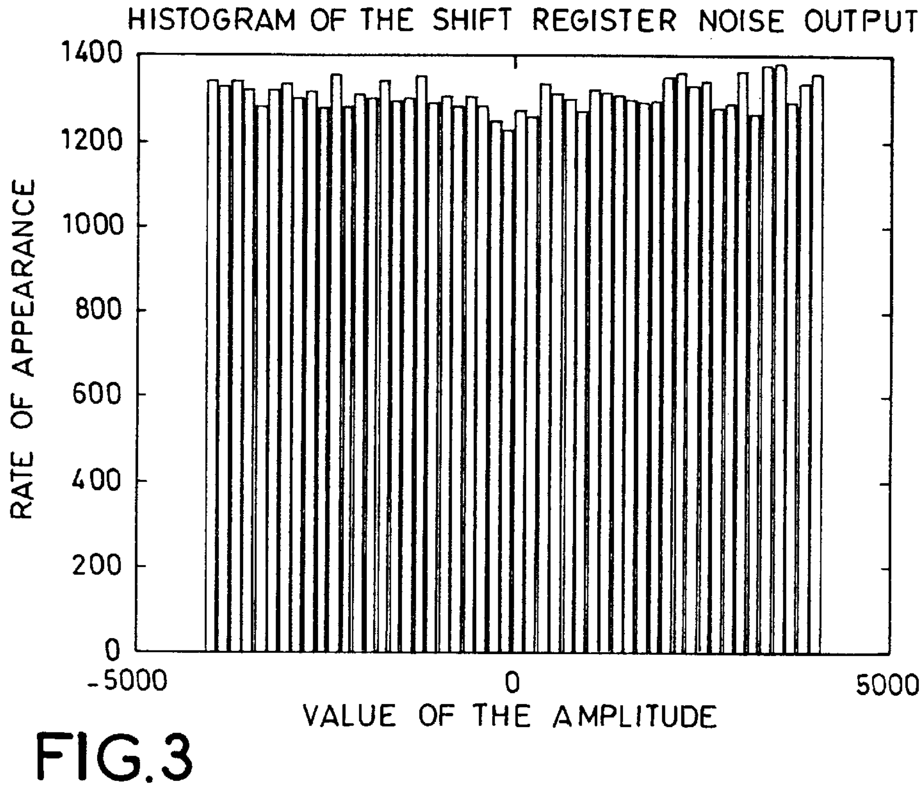
FIG. 3 is a histogram output from the first step of the method according to the invention.

FIG. 3 shows the histogram of the amplitudes of the PRN generator of FIG. 2. The value of the amplitude on the X-axis ranges from −4096 to +4095, the Y-axis corresponds to the rate of appearance of the different amplitudes. It must be noted that this rate is substantially equidistributed.

Figure 4:
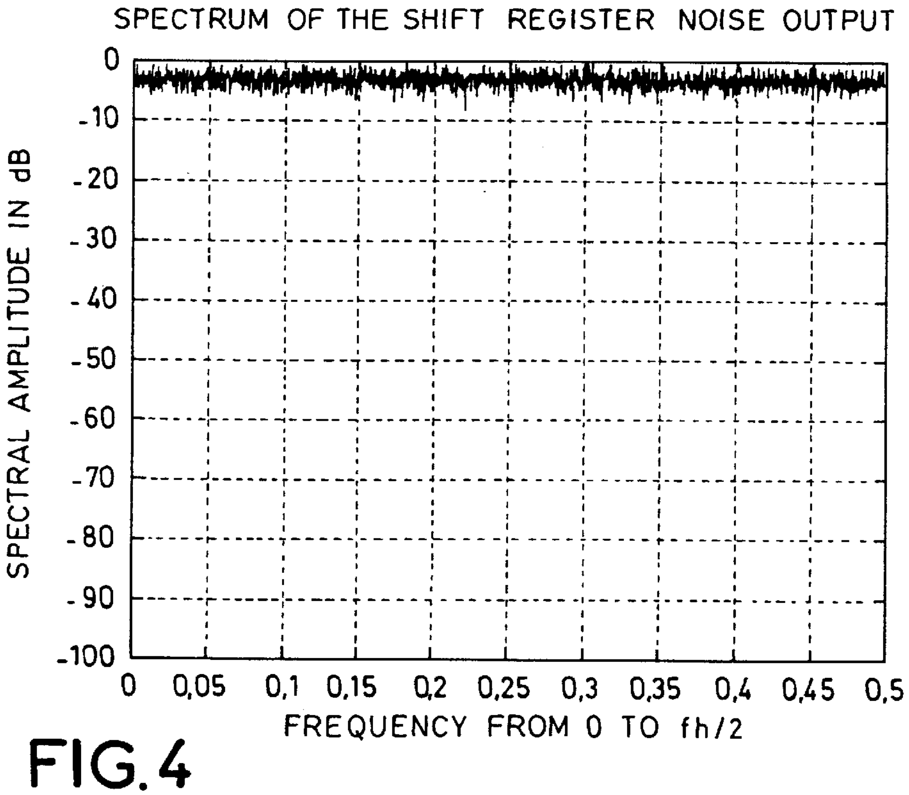
FIG. 4 shows a noise spectrum at output of a PRN generator, FIGS. 5 and 6, respectively show a histogram and the spectrum of the signal at output of the first filter.

FIG. 4 is a graph of the spectral amplitude, expressed in dB, as a function of the frequency of the signal s(t) generated by the PRN generator. The envelope of this signal is substantially constant between 0 and $F_H/2$.

One of the functions of the filters $F_1$ and $F_2$ used in the present invention is to notch out the spectrum of the PRN generator in the frequency band that will be the location of the useful signal as described here above, namely the useful signal to be converted without distortion by a DAC or an ADC.

Each filter participates differently, the characteristics of the first filter $F_1$ are optimized and chosen to notch out the signal within a limit where the non-linearity does not excessively destroy the effect of the filtering. The characteristics of the second filter $F_2$ are optimized and chosen to again hollow out the spectrum by the number of dB needed as a function of the dynamic range being sought.

To this end, the template of each of the filters $F_1$ and $F_2$ is determined so that the noise residue remaining in the useful band is compatible with the dynamic range sought for the useful signal. In this context, the term "dynamic range" represents the ratio between the level of the useful signal and the maximum level of the spurious signals in a given band in which the useful signals are located. Thus, depending on the application of the generator in an analog-digital or digital-analog conversion system, the spectrum of the random signal should not encroach on the band of the useful signals. The choice of the filter template depends for example on the spectral width of the random signal, the clock frequency of the DAC or the ADC and the dynamic range sought for the system.

Furthermore, in order to obtain a final histogram close to a rectangular distribution, a non-linearity function is applied between the two filtering steps.

The steps (b), (c) and (d) used to obtain such results are for example described here below.

A second step (b) is used to filter the band of the noise or to limit this band by making a hole in the portion of the spectrum in which the useful signal will be placed.

The filter $F_1$ is optimized for example so that this hole is limited to a depth of about 10 to 30 dB with respect to the maximum of the noise spectrum in a band at least equal to that of the useful signals and preferably from 15 to 25 dB. Indeed, the passage into non-linearity has the consequence especially of tending to fill up this hole at a level generally located around −25 dBc with respect to the maximum of the noise spectrum.

Figure 5:
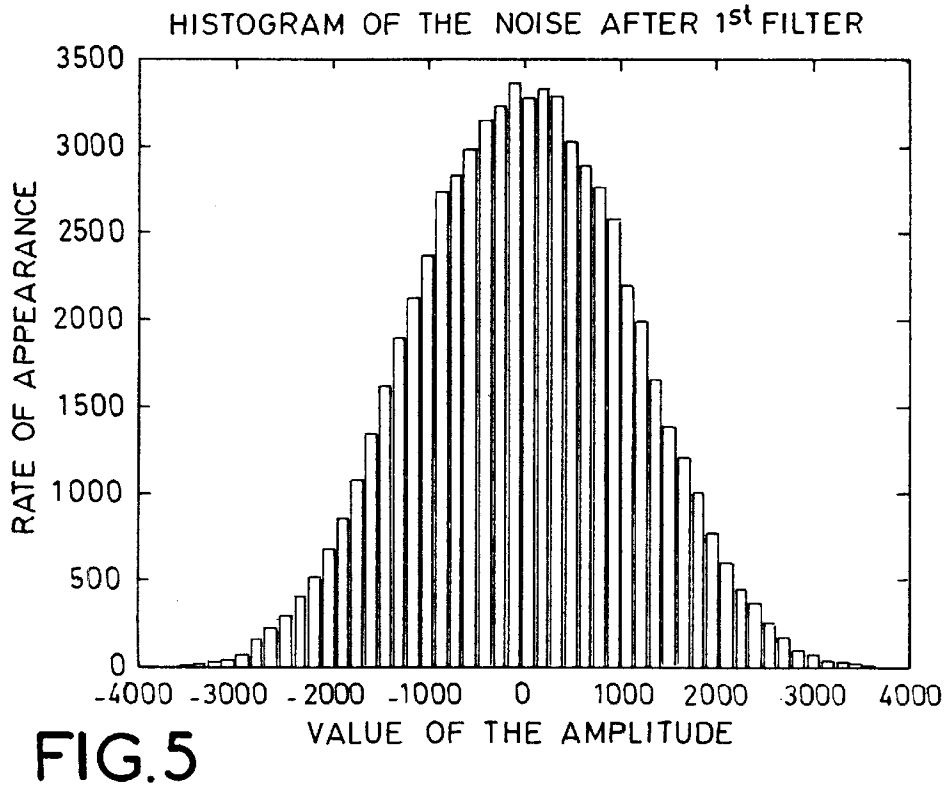

FIG. 5 shows a histogram of the noise signal after the filter $F_1$, the value of the amplitude being given on the X-axis and the rate of appearance being given on the Y-axis. This histogram tends towards a Gaussian distribution.

Figure 6:
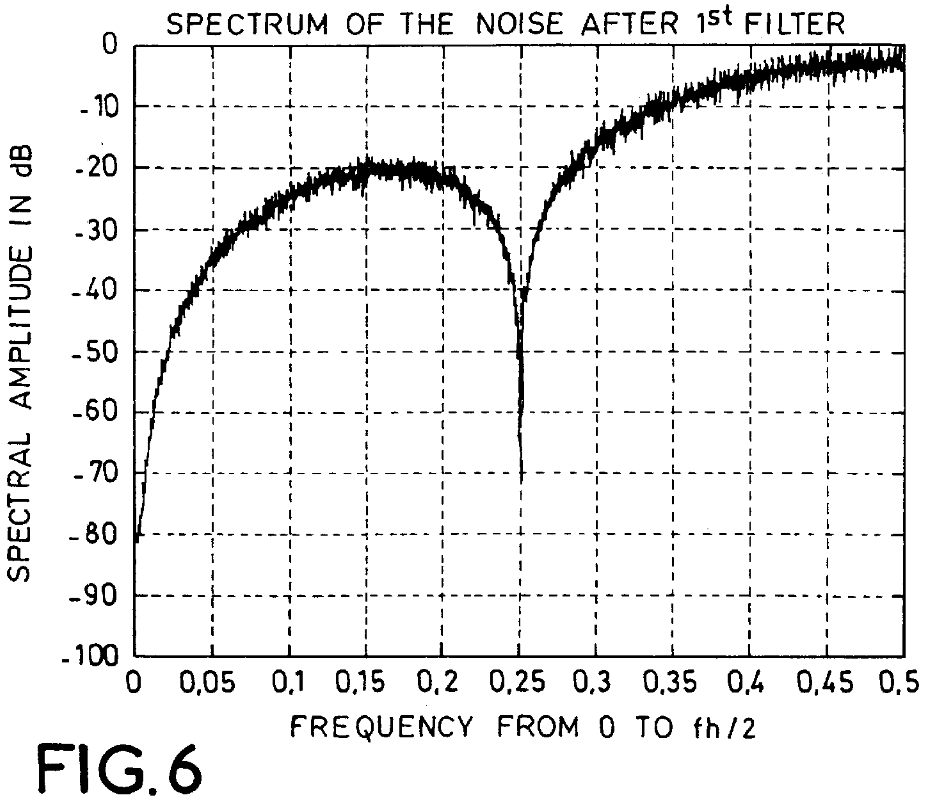

FIG. 6 gives the spectrum of the noise signal x(t) at output of the first filter $F_1$. This example has a notched-out hole of about −20 dBc with respect to the maximum noise around a frequency in the region of 0.15 $F_H$. The value −20 dBc is only an example given by way of an illustration. This value may vary especially as a the function of the application. In fact, the characteristics of the filter $F_1$ are chosen so that the non-linearity function does not excessively destroy the filtering effect as explained here above.

During a third step (c), the method applies a non-linear function to the signal x(t) coming from the first filter $F_1$ so as to create overshoots on the edges of the histogram of the signal obtained at output of F1. It is sought to favor the extreme amplitudes of the signal.

The non-linear function is constituted, for example, by facets, namely linear segments Di having slopes with different values. The ratio between the slopes of the different segments creates overshoots. The number of segments and the values of the slopes of the different segments depend for example on the histogram obtained at output of the filter $F_1$, hence on the application.

Figure 7:
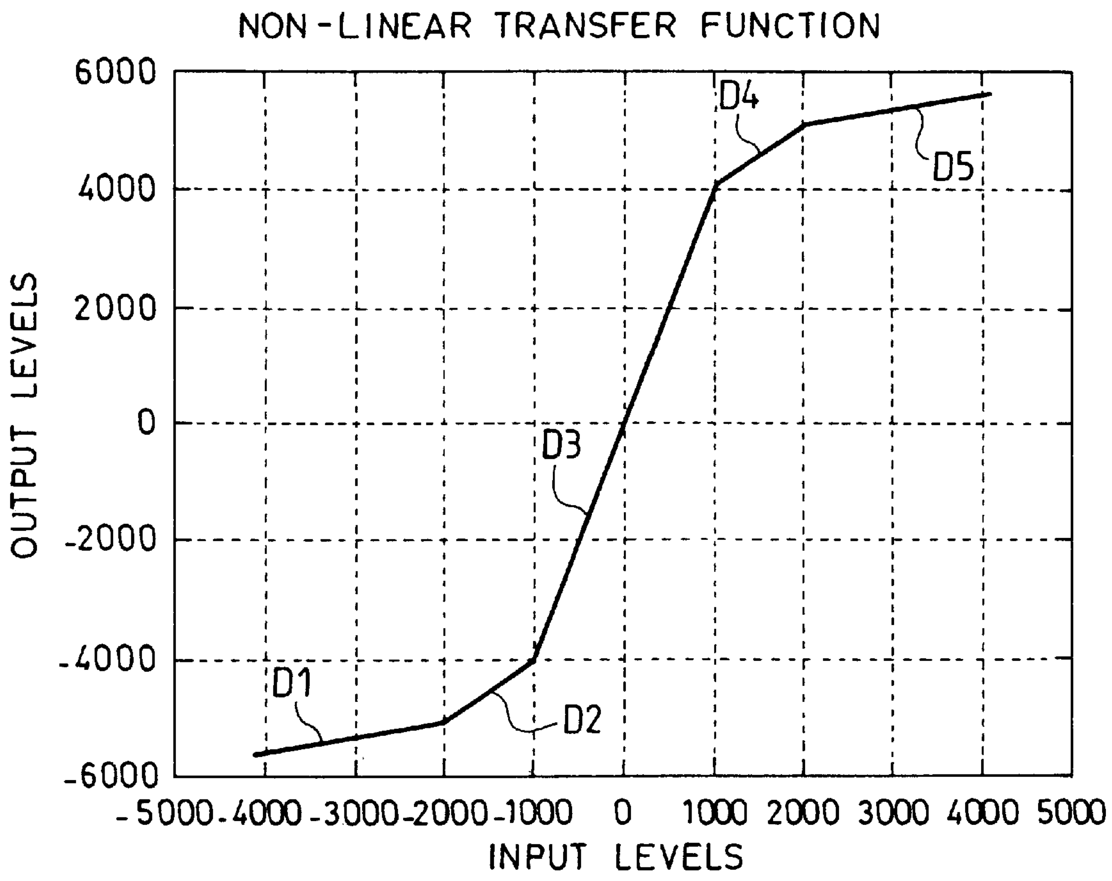
FIGS. 7, 8 and 9 show a non-linearity function, the histogram and the spectrum after application of the non-linearity function.

FIG. 7 illustrates an example of a non-linear function comprising five facets, $D_1$, $D_2$, $D_3$, $D_4$ and $D_5$, the X-axis corresponding to the instantaneous value of the signal x(t) and the Y-axis to the instantaneous value of the signal y(t) obtained by application of the non-linear function.

Figure 8:
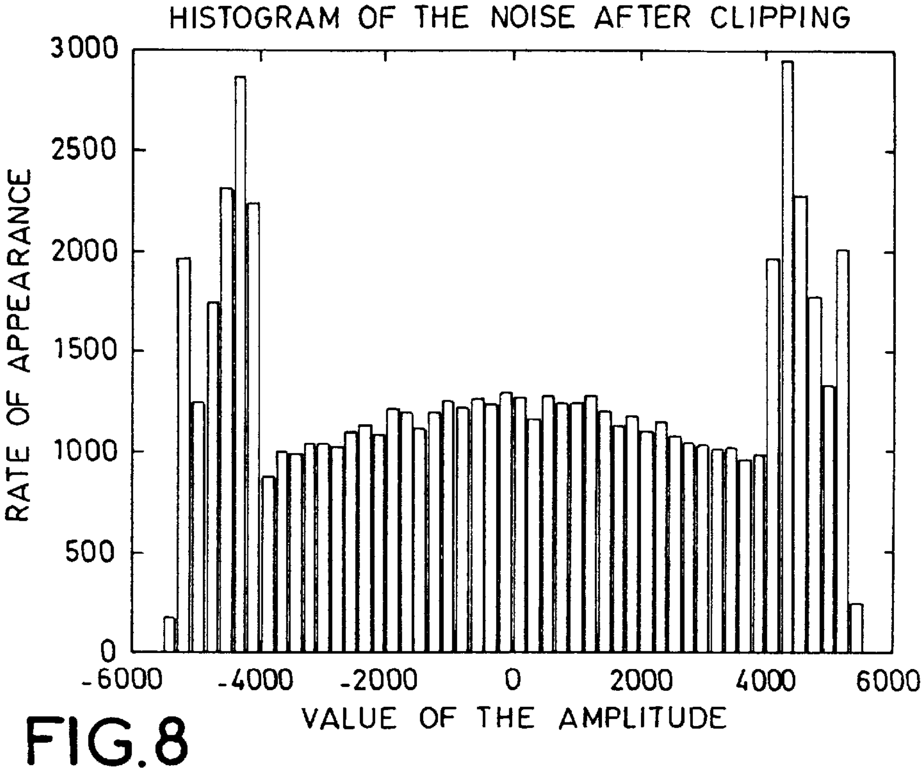

The histogram of the signal obtained after application of the non-linear function is shown in FIG. 8. The X-axis corresponds to the instantaneous value of the amplitude of the signal and the Y-axis-to its rate of appearance.

As compared with the histogram of FIG. 5, the present histogram shows a rectangular type of shape rather than a Gaussian shape with overshoots on the two far edges of the graph, the central part corresponding rather to a rectangular type of shape.

Figure 9:
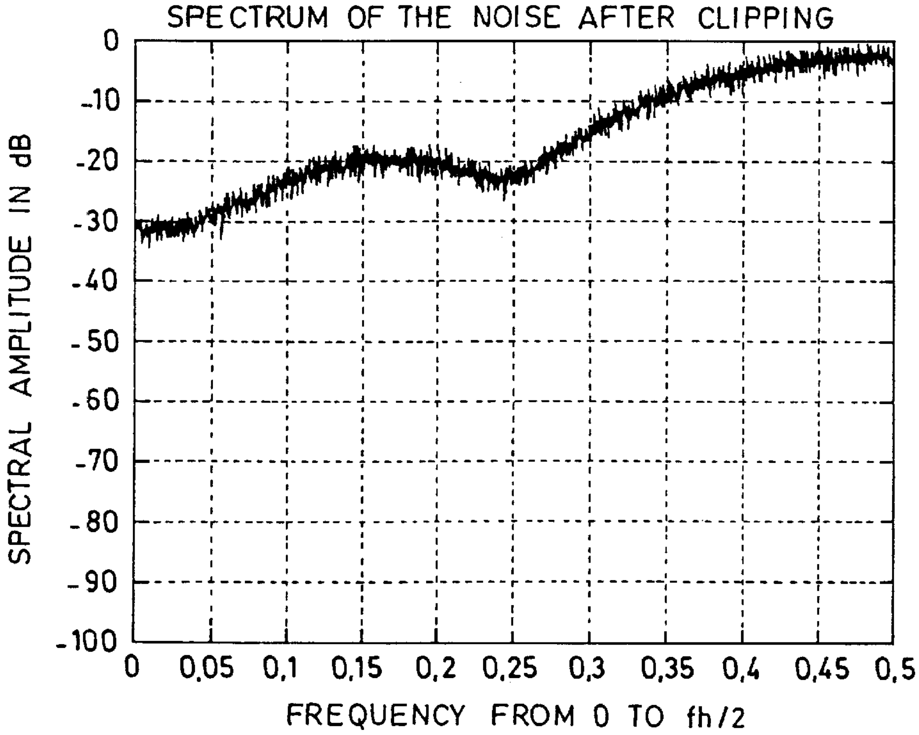

The spectrum of the signal y(t) obtained after application of the non-linear function is shown in FIG. 9. It will be noted that the notch obtained around the frequencies 0.25 FH has been "filled in" at a value ranging from −20 to −25 dBc.

Any non-linear function used to pass from a Gaussian probability to a rectangular distribution with overshoots may be used to perform the third step of the method.

In a fourth step (d) the signal y(t) is filtered so as to carry out the part of the filtering that it was not possible to implement in $F_1$, given for example the constraints dictated by the non-linearity.

Indeed, in order to optimize the roles of each of the filters, and taking account of the phenomena resulting from the application of the non-linearity, the characteristics of the filter $F_2$ are chosen especially to re-notch the spectrum by the necessary number of dB, as a function of the dynamic range sought and as a function of the filling-in effect resulting from the step (c) (application of the non-linear function).

Furthermore, this step smoothens the overshoots of the histogram.

The spectral part eliminated by the filter $F_2$ represents a relatively small part of the total power of the noise before $F_2$. Thus, the passage into the filter $F_2$ chiefly carries out a smoothening of the histogram obtained earlier at the step (c). The fact that the eliminated part represents a low-power part is due to the action of $F_1$ which has eliminated a large part of the noise power in the useful signal band, even if it has notched out the spectrum for example only by −20 dB and even if the non-linearity has not caused excessive deterioration in this value.

Figure 10:
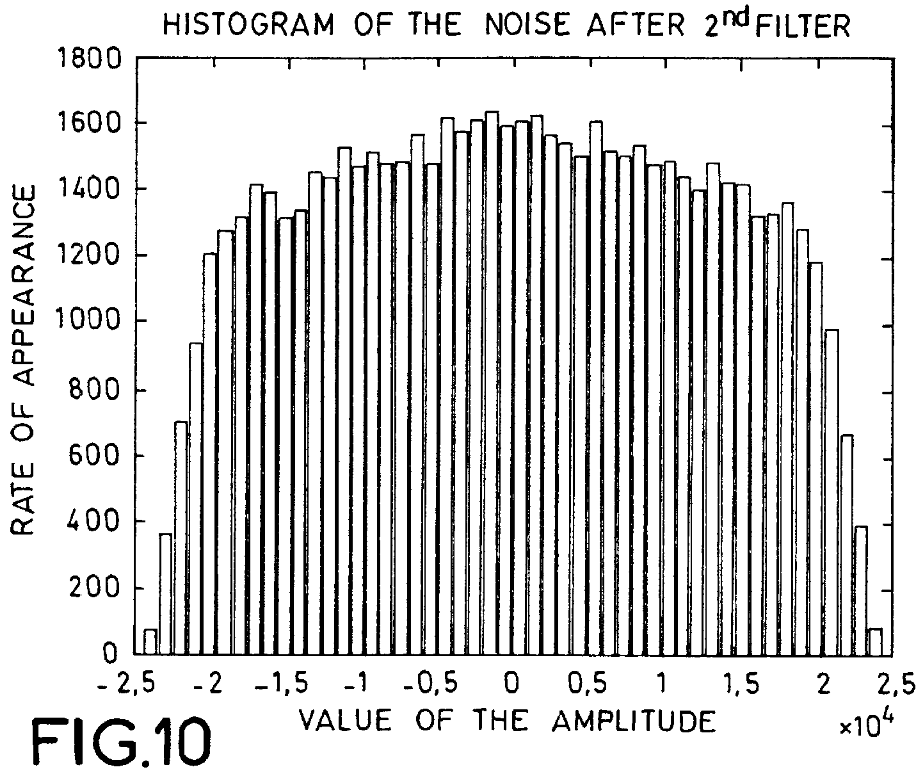
FIGS. 10 and 11 show a histogram and a spectrum at output of the second filter.

FIG. 10 shows the histogram of the noise after the filter $F_2$. It can be seen that this histogram is close to a rectangular distribution.

Figure 11:
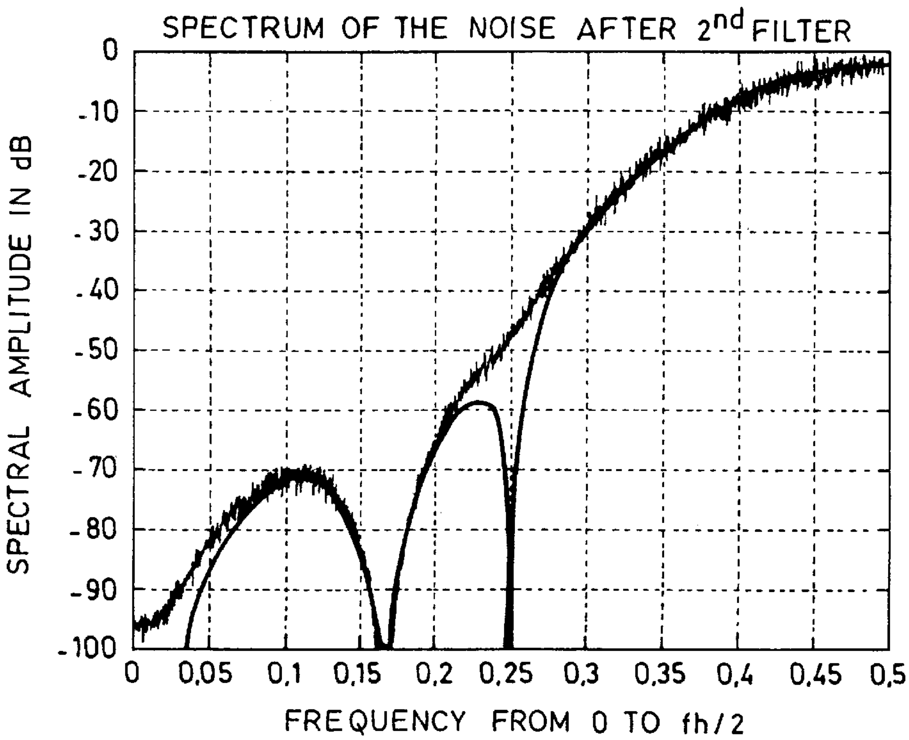

FIG. 11 is a graph of frequency/spectral amplitude expressed in dB, showing the noise spectrum obtained after the filter $F_2$ and a curve giving the theoretical response of the cascade of the two filters when the non-linearity function is not applied. The divergence between these two curves is the contribution of the non-linear function.

The filters $F_1$ and $F_2$ used to implement the invention are preferably filters with squared coefficients that do not require multiplication operations.

Without departing from the context of the invention, any filter used to make the desired filtering templates $F_1$ and $F_2$ may be used.

The filter $F_1$, corresponding for example to the curve obtained in FIG. 5, has a transfer function $H_1(z)$ expressed by the following relationship $$H_1(z)=1-(z+z^{-1})+½(z^2+z^{-2})$$

The filter $F_2$ has the following response:

$$H_2(z)=1,25-(z+z^{-1})+½(z^2+z^{-2})-⅛(z^3+z^{-3})$$

It may be noted that, by changing the negative signs − of the coefficients of $H_1$ and of $H_2$ into positive signs +, the noise becomes spectrally located around 0 with the notch around $F_H/2$. It is also possible to obtain a notch around $F_H/4$ by making the four blocs of the diagram work at a clock rate equal to $F_H/2$ and by oversampling the signal with a clock rate at $F_H$.

Without departing from the context of the invention, notches for other frequencies of the spectrum may be generated by using transfer functions other than those mentioned here above.

The filters will preferably be made in an FPGA (Field Programmable Gate Array) or EPLD or ASIC type digital circuit. Any digital circuit comprising elements known to those skilled in the art, used to make filters, may also be used. The filters are therefore digital type filters.

Without departing from the framework of the invention, any filter adapted to obtaining the desired filtering templates and any device for the generation of pseudo-random codes or noises may be used in the present invention.

Figure 12:
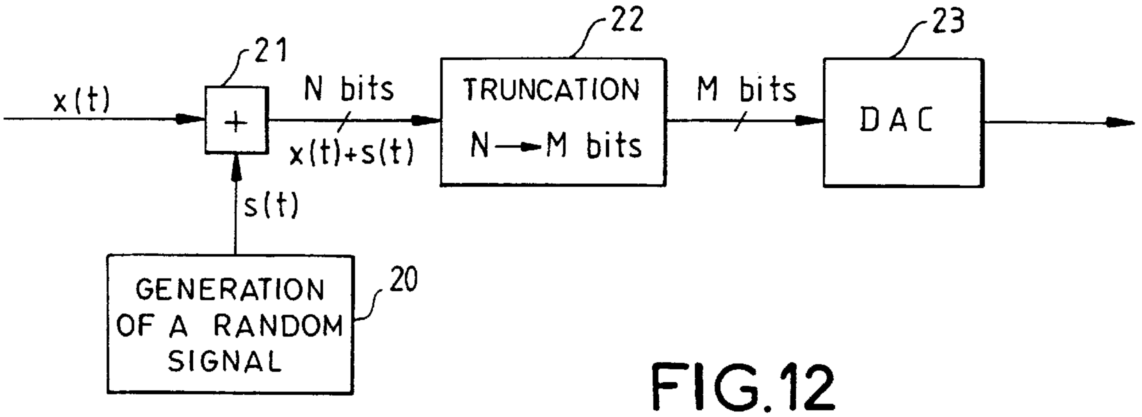
FIG. 12 shows a possible embodiment of a digital-analog conversion system using a random signal generated according to the invention, FIG. 13 exemplifies a system of analog-digital conversion using a random signal generated according to the invention.

FIG. 12 illustrates the application of the method according to the invention to a digital-analog conversion system contained for example in a digital synthesizer. In this application, a useful signal x(t), which is a digital signal, has to be converted into an analog quantity with the best possible linearity, i.e. in fact with the least possible spurious signals. This useful signal x(t) is therefore added to a random signal s(t) obtained according to the method of the invention by adapted generation means 20. The two signals x(t) and s(t) are combined by an adder 21. These two signals are digital signals. In preferred embodiment of the conversion system, the random signal s(t) has an amplitude close to or greater than the amplitude of the signal x(t) and a histogram and spectral envelope obtained according to the steps implemented in the method. Truncation methods 22 may be used if necessary before the passage into the converter 23.

Figure 13:
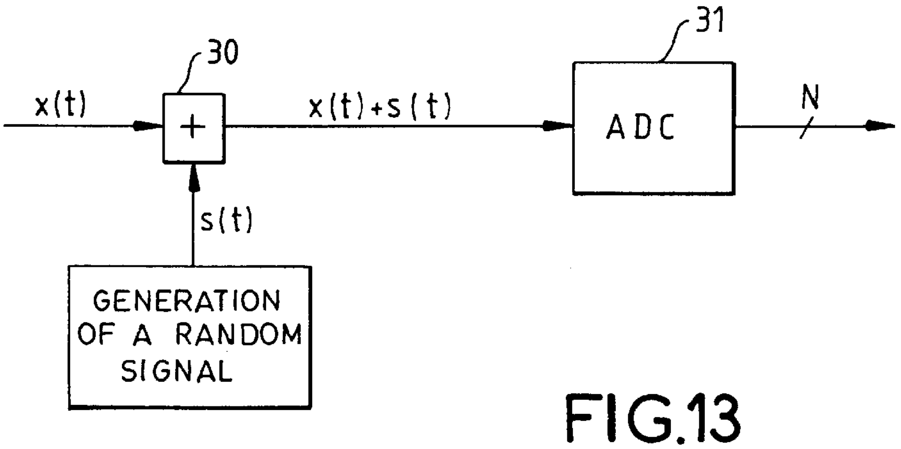

FIG. 13 exemplifies an application of the method according to the invention to an analog-digital conversion system. In this case, the useful signal x(t) and the random signal s(t) are analog signals. These two signals are added up by an analog adder 30. The sum signal x(t)+s(t) is present at the input of an analog-digital converter 31 whose output is encoded for example on N bits. The random signal has characteristics substantially identical to those of the signal described in FIG. 12. It may also be generated by means substantially identical to those described in FIG. 12 and then converted by a DAC so as to obtain an analog signal before adding it.

What is claimed is:

1. A method for the generation of a random signal, comprising at least the following steps:

A first step (a) for the generation of a pseudo-random signal, a second step (b) for filtering ($F_1$) of the signal coming from the step (a) to obtain a signal x(t) having a predetermined spectral envelope H(f), a third step (c) in which a non-linear function g is applied to the signal x(t) so as to form a signal y(t) and create overshoots on the edges of the histogram of the signal y(t), a fourth filter ($F_2$) step (d) used to smoothen the overshoots of the histogram of the signal y(t), compensate for the effect of the non-linearity and carry out an additional filtering at ($F_1$).

2. A method according to claim 1, wherein the non-linear function is a function with facets $D_i$ and wherein the number of the segments and the ratio of the slopes of the different segments are chosen as a function of the histogram obtained from the filtering step $F_1$.

3. A method according to one of the claims 1 or 2 wherein the filter $F_1$ generates a notch of about 10 to 30 dB, preferably 15 to 25 dB, in a band at least equal to that of the useful signals.

4. A method according to one of the claims 1 to 3, wherein the histogram obtained at the end of the step (d) is substantially identical to a rectangular distribution.

5. A method according to one of the claims 1 to 4, wherein the pseudo-random signal is a white noise.

6. A method according to claim 1, wherein the four steps are applied in a digital-analog conversion system or an analog-digital conversion system.

7. A device for generating a random signal comprising:

means for generating a pseudo-random signal, means ($F_1$) for filtering the pseudo-random signal in order to obtain a signal x(t) having a predetermined spectral envelope (H(f), a device configured to generate a non-linear function to form a signal y(t) from the signal x(t) having a Gaussian type of histogram, the histogram of this signal y(t) being of a rectangular type with overshoots, means ($F_2$) for smoothening the overshoots of the histogram of the signal y(t), compensating for the effect of non-linearity and making an additional filtering at ($F_1$).

8. A device according to claim 7, wherein the device configured to generate a non-linear function is designed to obtain a non-linear function with facets Di.

9. A device according to one of the claims 7 and 8, wherein at least one of the filters $F_1$ or $F_2$ is a filter with squared coefficients.

10. A device according to one of the claims 7 and 8 wherein the signal generated is a white noise.

11. A device according to claim 7, wherein the device is used in a digital-analog conversion system or an analog-digital conversion system.

* * * * *